(12) United States Patent
Germann et al.

(10) Patent No.: US 10,872,176 B2
(45) Date of Patent: Dec. 22, 2020

(54) METHODS OF MAKING AND MONITORING A COMPONENT WITH AN INTEGRAL STRAIN INDICATOR

(71) Applicant: General Electric Company, Schenectady, NY (US)

(72) Inventors: Bryan Joseph Germann, Greenville, SC (US); Gregory Lee Hovis, Martinez, GA (US)

(73) Assignee: General Electric Company, Schenectady, NY (US)

(*) Notice: Subject to any disclaimer, the term of this patent is extended or adjusted under 35 U.S.C. 154(b) by 664 days.

(21) Appl. No.: 15/412,489

(22) Filed: Jan. 23, 2017

(65) Prior Publication Data

US 2018/0210971 A1    Jul. 26, 2018

(51) Int. Cl.
| | |
|---|---|
| *G06F 30/00* | (2020.01) |
| *G01B 11/24* | (2006.01) |
| *G01B 21/04* | (2006.01) |
| *G01B 11/00* | (2006.01) |

(52) U.S. Cl.
CPC ............ *G06F 30/00* (2020.01); *G01B 11/002* (2013.01); *G01B 11/24* (2013.01); *G01B 21/047* (2013.01)

(58) Field of Classification Search
CPC ....... G06F 17/50; G01B 11/002; G01B 11/24; G01B 21/047; G01B 11/00; G01B 9/00; Y10T 29/49103
USPC .......................................................... 703/1
See application file for complete search history.

(56) References Cited

U.S. PATENT DOCUMENTS

| | | |
|---|---|---|
| 4,528,856 A | 7/1985 | Junker et al. |
| 4,746,858 A | 5/1988 | Metala et al. |
| 4,782,705 A | 11/1988 | Hoffmann et al. |
| 4,859,062 A | 8/1989 | Thurn et al. |
| 6,078,396 A | 6/2000 | Manzouri |
| 6,175,644 B1 | 1/2001 | Scola et al. |
| 6,574,363 B1 | 6/2003 | Classen et al. |
| 6,983,659 B2 | 1/2006 | Soechting et al. |
| 6,986,287 B1 | 1/2006 | Dorfman |
| 7,200,259 B1 | 4/2007 | Gold et al. |

(Continued)

FOREIGN PATENT DOCUMENTS

| | | |
|---|---|---|
| CN | 201402124 Y | 2/2010 |
| DE | 10 2010 008 985 A1 | 6/2011 |

(Continued)

OTHER PUBLICATIONS

Extended European Search Report and Opinion issued in connection with corresponding EP Application No. 18152067.7 dated Apr. 9, 2018.

(Continued)

*Primary Examiner* — Justin C Mikowski
(74) *Attorney, Agent, or Firm* — Dority & Manning, P.A.

(57) ABSTRACT

Methods of making a component with an integral strain indicator and methods of monitoring such components are provided. A method for making a component includes forming the component, the component including an internal volume and an outer surface. The method further includes forming a plurality of fiducial markers on the component, wherein each of the plurality of fiducial markers is a depression defined in the component. The plurality of fiducial markers are positioned in an analysis region of the component.

15 Claims, 6 Drawing Sheets

(56) References Cited

U.S. PATENT DOCUMENTS

| | | |
|---|---|---|
| 7,227,648 B2 | 6/2007 | Weinhold |
| 7,414,732 B2 | 8/2008 | Maidhof et al. |
| 7,421,370 B2 | 9/2008 | Jain et al. |
| 7,441,464 B2 | 10/2008 | Turnbull et al. |
| 7,477,995 B2 | 1/2009 | Hovis et al. |
| 7,490,522 B2 | 2/2009 | Ruehrig et al. |
| 7,533,818 B2 | 5/2009 | Hovis et al. |
| 7,689,003 B2 | 3/2010 | Shannon et al. |
| 7,697,966 B2 | 4/2010 | Monfre et al. |
| 7,849,752 B2 | 12/2010 | Gregory et al. |
| 8,245,578 B2 | 8/2012 | Ranson et al. |
| 8,307,715 B2 | 11/2012 | Ranson |
| 8,511,182 B2 | 8/2013 | Bjerge et al. |
| 8,600,147 B2 | 12/2013 | Iliopoulos et al. |
| 8,818,078 B2 | 8/2014 | Telfer et al. |
| 8,994,845 B2 | 3/2015 | Mankowski |
| 9,128,063 B2 | 9/2015 | Dooley |
| 9,200,889 B2 | 12/2015 | Swiergiel et al. |
| 9,207,154 B2 | 12/2015 | Harding et al. |
| 9,311,566 B2 | 4/2016 | Iliopoulos et al. |
| 9,316,571 B2 | 4/2016 | Müller et al. |
| 9,423,243 B1* | 8/2016 | Ikeda ............ G01B 11/168 |
| 2003/0079551 A1* | 5/2003 | Hata ............ G01L 1/2287 73/760 |
| 2006/0112775 A1* | 6/2006 | Krauskopf ............ G01D 13/04 73/866.3 |
| 2006/0227210 A1* | 10/2006 | Raab ............ G01B 11/002 348/139 |
| 2010/0168763 A1* | 7/2010 | Zhao ............ A61B 34/30 606/130 |
| 2010/0310128 A1* | 12/2010 | Iliopoulos ............ G01B 11/165 382/103 |
| 2011/0103933 A1* | 5/2011 | Olesen ............ F03D 17/00 415/118 |
| 2013/0013224 A1 | 6/2013 | Ito et al. |
| 2013/0194567 A1 | 8/2013 | Wan et al. |
| 2013/0202192 A1* | 8/2013 | Telfer ............ F02C 1/00 382/154 |
| 2014/0000380 A1 | 1/2014 | Slowik et al. |
| 2014/0149296 A1* | 5/2014 | Chang ............ G06Q 10/20 705/305 |
| 2014/0267677 A1 | 9/2014 | Ward, Jr. et al. |
| 2015/0239043 A1* | 8/2015 | Shipper, Jr. ............ F01D 21/003 415/208.1 |
| 2015/0251272 A1* | 9/2015 | Sieben ............ G01B 11/002 156/360 |
| 2015/0346057 A1* | 12/2015 | Ward, Jr. ............ C23C 4/11 73/762 |
| 2015/0369757 A1* | 12/2015 | Golubovic ............ G06T 7/0008 378/19 |
| 2016/0161242 A1 | 6/2016 | Cook et al. |
| 2016/0313114 A1 | 10/2016 | Tohme et al. |
| 2016/0354174 A1 | 12/2016 | Demir |

FOREIGN PATENT DOCUMENTS

| | | |
|---|---|---|
| JP | H07-219266 A | 8/1995 |
| JP | 2002-090118 A | 3/2002 |
| JP | 2016-156762 A | 9/2016 |
| WO | WO 2014/031957 | 2/2014 |

OTHER PUBLICATIONS

Hovis, G.L. et al., Methods of Making and Monitoring Components with Integral Strain Indicators, GE Co-Pending U.S. Appl. No. 15/437,515, filed Feb. 21, 2017.

* cited by examiner

METHODS OF MAKING AND MONITORING A COMPONENT WITH AN INTEGRAL STRAIN INDICATOR

FIELD

The present disclosure relates generally to methods for making and monitoring components having integral strain indicators.

BACKGROUND

Throughout various industrial applications, apparatus components are subjected to numerous extreme conditions (e.g., high temperatures, high pressures, large stress loads, etc.). Over time, an apparatus's individual components may suffer creep and/or deformation that may reduce the component's usable life. Such concerns might apply, for instance, to some turbomachines.

Turbomachines are widely utilized in fields such as power generation and aircraft engines. For example, a conventional gas turbine system includes a compressor section, a combustor section, and at least one turbine section. The compressor section is configured to compress a working fluid (e.g., air) as the working fluid flows through the compressor section. The compressor section supplies a high pressure compressed working fluid to the combustors where the high pressure working fluid is mixed with a fuel and burned in a combustion chamber to generate combustion gases having a high temperature and pressure. The combustion gases flow along a hot gas path into the turbine section. The turbine section utilizes the combustion gases by extracting energy therefrom to produce work. For example, expansion of the combustion gases in the turbine section may rotate a shaft to power the compressor, an electrical generator, and other various loads.

During operation of a turbomachine, various components within the turbomachine, and particularly components along the hot gas path such as turbine blades within the turbine section of the turbomachine, may be subject to creep due to high temperatures and stresses. For turbine blades, creep may cause portions of or the entire blade to elongate so that the blade tips contact a stationary structure, for example a turbine casing, and potentially cause unwanted vibrations and/or reduced performance during operation.

BRIEF DESCRIPTION

Aspects and advantages of the invention will be set forth in part in the following description, or may be obvious from the description, or may be learned through practice of the invention.

In accordance with one embodiment of the present disclosure, a method of making a component with an integral strain indicator is provided. The method includes forming the component, the component including an internal volume and an outer surface. The method further includes forming a plurality of fiducial markers on the component, wherein each of the plurality of fiducial markers is a depression defined in the component. The plurality of fiducial markers are positioned in an analysis region of the component.

In some embodiments, the analysis region defines a gauge length, and each of the plurality of fiducial markers has a maximum diameter of between one-tenth and one-twentieth of the gauge length.

In accordance with another embodiment of the present disclosure, a method of monitoring a component is provided. The component includes an internal volume and an outer surface. The method includes initially measuring a plurality of fiducial markers formed on a portion of the component, wherein each of the plurality of fiducial markers is a depression defined in the component, and creating a three-dimensional model of the component based on the initial measurement. The method further includes subjecting the component to at least one duty cycle. The method further includes subsequently measuring the plurality of fiducial markers after the at least one duty cycle, and creating a three-dimensional model of the component based on the subsequent measurement. The method further includes comparing the three-dimensional model based on the initial measurement to the three-dimensional model based on the subsequent measurement.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
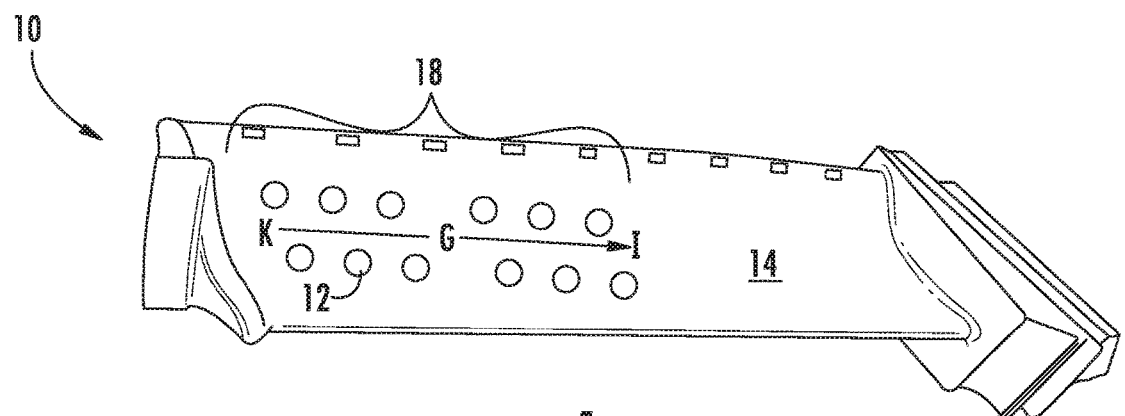
FIG. 1 is a perspective view of an exemplary component including a plurality of fiducial markers in accordance with embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Referring to FIG. 1, an exemplary component 10 is illustrated with a plurality of fiducial markers 12 formed on the component's exterior surface 14. The component 10 can be any of a variety of types of components used in a variety of different applications, such as, for example, components utilized in high temperature applications (e.g., components comprising nickel or cobalt based superalloys). In some embodiments, the component 10 may be an industrial gas turbine or steam turbine component such as a combustion component or hot gas path component. In some embodiments, the component 10 may be a turbine blade, compressor blade, vane, nozzle, shroud, rotor, transition piece or casing. In other embodiments, the component 10 may be any other component of a turbine such as any other component for a gas turbine, steam turbine or the like. In some embodiments, the component may be a non-turbine component including, but not limited to, automotive components (e.g., cars, trucks, etc.), aerospace components (e.g., airplanes, helicopters, space shuttles, aluminum parts, etc.), locomotive or rail components (e.g., trains, train tracks, etc.), structural, infrastructure or civil engineering components (e.g., bridges, buildings, construction equipment, etc.), and/ or power plant or chemical processing components (e.g., pipes used in high temperature applications).

As illustrated for example in FIG. 1, the exemplary component 10 has an exterior surface 14 on which the fiducial markers 12 are positioned. The example component 10 shown in the illustrative embodiment of FIG. 1 is a turbine component, and more specifically a turbine blade. However, the component 10 can be various additional or alternative components, as described above. The fiducial markers 12 are generally identifiable targets, each having a length L and width W (see FIG. 5). As discussed herein, fiducial markers 12 in accordance with the present disclosure are depressions defined in the component 10. Accordingly, the fiducial markers 12 may each further have a depth D (see FIG. 2) extending into the component.

Figures 2, 3:
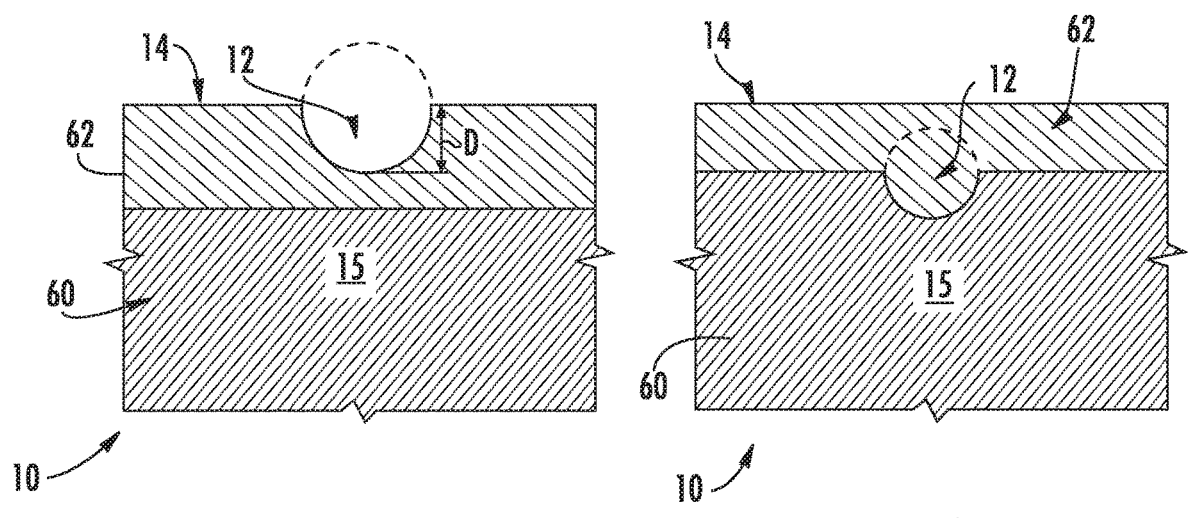
FIG. 2 is a partial section view of a plurality of fiducial markers formed on a component in accordance with embodiments of the present disclosure.
FIG. 3 is a partial section view of a plurality of fiducial markers formed on a component in accordance with other embodiments of the present disclosure.

As illustrated for example in FIGS. 1 and 2, the exemplary component 10 has an interior volume 15 which is formed from a first material. Various cooling passages (not shown) may be defined in the interior volume 15. In some embodiments, such as when the component 10 is a turbine blade or other turbine component, suitable materials for the interior volume 15 may include high performance nickel-based superalloys such as GTD-111, GTD-141, GTD-444, R108, INCONEL™ 738, or single crystal N4 and N5. Alternatively, other suitable metals or other materials may be utilized.

The component 10 may, for example, include a base component 60. The base component 60 may include the interior volume 15. In some embodiments, the base component 60 may further include the outer surface 14. Accordingly, in these embodiments, the outer surface 14 may be formed from the first material. Alternatively, as illustrated in FIGS. 2 and 3, one or more additional layers of component 10 may be included on the base component 60. For example, a thermal barrier layer 62 may be provided on the base component. The thermal barrier layer 62 may include the outer surface 14. Suitable materials for use as thermal barrier layers 62 may include, for example, yttria-stabilized zirconia ("YSZ") or suitable ceramic-based compositions having low thermal conductivities. Notably, in some embodiments, additional layers such as bond layers may be provided between the thermal barrier layer 62 and the base component 60. Suitable materials for use as bond layers may include, for example, GE33, GE55, Gel Aluminide, GT21, GT29, or GT33.

As shown in FIGS. 2 and 3, fiducial markers 12 in accordance with the present disclosure are depressions which are defined in the component. Accordingly, the fiducial markers 12 extend inwardly into the component. In some embodiments, as shown in FIG. 2, the fiducial markers 12 may be defined in the outer surface 14. Alternatively, the fiducial markers 12 may be defined within the component 10. For example, as shown in FIG. 3, the fiducial makers 12 may be formed on and thus defined in the base component 60.

Referring now to FIGS. 1 through 6, the fiducial markers 12 are positioned on a portion 18 of the exterior surface 14 of the component 10. In exemplary embodiments, at least two discrete markers (e.g., 12a and 12b) are provided, such a distance D can be measured between said at least two markers 12a and 12b. As should be appreciated to those skilled in the art, these measurements can help determine the amount of strain, strain rate, creep, fatigue, stress, etc. at that region of the component 10. The at least two discrete markers 12a and 12b can be disposed at a variety of distances and in a variety of locations depending on the specific component 10 so long as the distance DI there between can be measured.

The fiducial markers 12 may have any suitable shapes, such as dots, lines, circles, rectangles or any other geometrical or non-geometrical shape, so long as they are consistently identifiable and may be used to measure the distance DI therebetween. The fiducial markers 12 may form a variety of different configurations and cross-sections such as by incorporating a variety of differently shaped, sized, and positioned fiducial markers 12. For instance, each fiducial marker 12 may include a matched or unique shape. In some embodiments, each marker 12 may define a circular shape, rectangular shape, or linear shape that is the same (i.e., matched) or unique from another fiducial marker.

As discussed, the fiducial markers 12 are depressions defined in the component 10. Various suitable methods may be utilized for forming the fiducial markers 12 on the component 10. For example, in some embodiments, the fiducial markers 12 may be formed during formation of the component 10, which may be formed for example using suitable casting processes or other suitable manufacturing processes. Alternatively, the fiducial markers 12 may be formed after formation of the component 10, using suitable subtractive techniques. Examples of such techniques include laser removal, etching, etc.

In exemplary embodiments, suitable methods of forming the fiducial markers 12 include methods that do not affect the grain structure of the component 10. For example, it may be verified in practice that the grain structure of component 10 has not been affected through microscopic analysis, such as with an electron scanning microscope, of a test piece or sample. Additionally, methods of forming the fiducial markers 12 may be suitable in accordance with the present disclosure when such methods do not create stress risers in the component 10.

As a result formation, the fiducial markers 12 are integrally joined with the component 10, so as to reduce or minimize movements of the fiducial markers 12 independent or in excess of the component 10. Accordingly, the fiducial markers 12 in accordance with the present disclosure are integral passive strain indicators of the component 10. Further, the direct formation of fiducial markers 12 on the component 10 may increase durability and reduce the risk that suitable measurement devices will be unable to measure the markers 12 over time.

In some embodiments, the portion of the outer surface 14 on which the fiducial markers 12 are formed may be an analysis region 18 on the outer surface 14 of the component 10. In such embodiments, the major dimension of the analysis region 18 defines a gauge length G of the analysis region 18. In some embodiments which include an analysis region 18 having a gauge length G, the fiducial markers 12 may each have a maximum diameter MD (FIG. 4), and the maximum diameter MD of each fiducial marker 12 may be between one-eighth and one-twenty fifth, such as between one-tenth and one-twentieth, of the gauge length G. In various embodiments, the gauge length G of the analysis region 18 may be between two-tenths of an inch (0.2") and one and two-tenths inches (1.2"), such as between three-tenths of an inch (0.3") and one inch (1.0"). In various exemplary embodiments, the maximum diameter MD of the markers 12 may be between one hundredth of an inch (0.01") and fifteen hundredths of an inch (0.15"), such as two hundredths of an inch (0.02") and twelve hundredths of an inch (0.12"). In some exemplary embodiments, the gauge length G may be three tenths of an inch (0.3"), and the maximum diameter MD of the markers 12 may be between fifteen thousandths of an inch (0.015") and three hundredths of an inch (0.03"). It should be understood that the maximum diameter MD of one fiducial marker 12 may differ from that of other fiducial markers 12, e.g., the maximum diameters MD may all be within the same range but not necessarily equal to one another. Notably, the relatively large distance between markers 12 relative to the size of the markers 12 may advantageously provide a relatively accurate representation of the strain on the component 10 itself by avoiding or reducing the influence of deformation of the markers 12 on the measured changes resulting from stress and/or strain on the component 10.

As noted above, in some embodiments fiducial marker 12 may have a depth D (see FIGS. 2 and 3). Also as noted above, in certain exemplary embodiments, the component 10 may be a turbine blade or other suitable aerodynamic component. Advantageously, the size and depressive nature of the fiducial markers 12 is preferably small enough to, in these embodiments, not impact the aerodynamics of the component while also being large enough to measure as discussed herein. Accordingly, in exemplary embodiments, the depth D of the fiducial markers 12 may be between one thousandth of an inch (0.001") and thirty thousands of an inch (0.030"), such as between three thousandths of an inch (0.003") and twenty-five thousandths of an inch (0.025"), such as between six thousandths of an inch (0.006") and twenty thousandths of an inch (0.020"), such as between eight thousandths of an inch (0.008") and fifteen thousandths of an inch (0.015").

Figure 4:
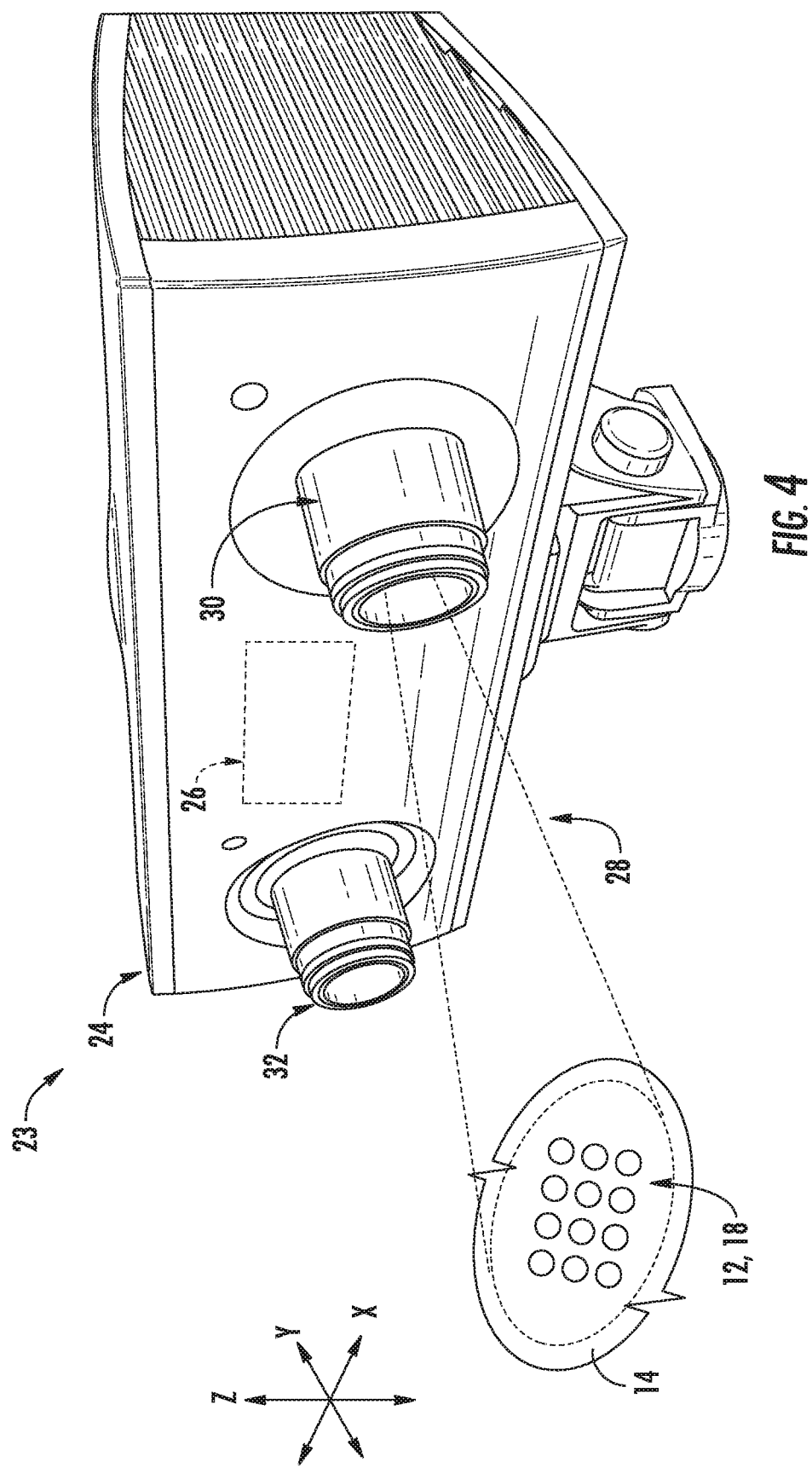
FIG. 4 is a perspective view of a system for monitoring component strain in accordance with embodiments of the present disclosure.

As discussed in more detail below, various embodiments include directly measuring the plurality of fiducial markers 12 using a three-dimensional data acquisition device, such as with an optical scanner 24 (FIG. 4). The optical scanner 24 or other suitable device may, in some embodiments, have a field of view, i.e., a maximum areal extent that the device can capture in a single image or pass. In such embodiments, the gage length G of the analysis region 18 may preferably be at least one-third (⅓) of the field of view longest dimension, e.g., when the field of view is elliptical, the major axis of the ellipse defined by the field of view. For example, as will be discussed in more detail below, in some example embodiments, the optical scanner 24 may be a structured light scanner, and an exemplary embodiment of such scanners may have a sixty millimeter (60 mm) field of view. In such embodiments, the gauge length G of the analysis region 18 may be at least twenty millimeters (20 mm). Further, in such embodiments, the field of view of scanner 24 or other suitable device may provide an upper limit on the size of analysis region 18, e.g., analysis region 18 may be sized such that all of the plurality of fiducial markers 12 can fit within the field of view.

The fiducial markers 12 may be positioned in one or more of a variety of locations on various components. For example, as discussed above, the fiducial markers 12 may be positioned on a turbine blade, vane, nozzle, shroud, rotor, transition piece or casing. In such embodiments, the fiducial markers 12 may be configured in one or more locations known to experience various forces during unit operation such as on or proximate airfoils, platforms, tips or any other suitable location. Moreover, the fiducial markers 12 may be deposited in one or more locations known to experience elevated temperatures. For example the fiducial markers 12 may be positioned in a hot gas path and/or on a combustion component 10. In some embodiments, the analysis region may include a life-limiting region of the component, e.g., a high stress or high creep region and/or a region with close tolerances or clearances. For example, in embodiments wherein the component 10 is a turbine blade of a gas turbine engine, there may be a close clearance between the turbine blade and a casing of the turbine at or near an outer portion of the blade. As such, the outer portion of the blade may be life-limiting in that deformation of that portion could potentially cause the casing to interfere with rotation of the blade. In other embodiments, the analysis region 18 may include substantially the entire exterior surface 14 of component 10. Such embodiments may permit the optional detection of local strain across selective variable sub-portions (e.g., the region between two adjacent markers 12), and/or detection of global strain across the component 10.

The plurality of fiducial markers 12 may be disposed on outer surface 14 of the component 10 in any suitable number and arrangement. Providing at least four fiducial markers 12 may advantageously permit measurement and analysis of full strain components, i.e., all three strain components. For example, providing at least four fiducial markers 12 may advantageously permit a 2D strain field measurement and analysis, and providing at least seven fiducial markers 12 may advantageously permit a 3D strain field measurement and analysis. The fiducial markers 12 may in various exemplary embodiments be arranged along a regular grid, e.g., such that the markers 12 define a rectangular shape. In at least one alternative embodiment, the fiducial markers 12 may be arranged in a linear fashion or other regular pattern. In other alternative embodiments, the fiducial markers 12 may be arranged in a non-linear pattern and/or may define an irregular shape. Various combinations of such embodiments are possible, e.g., four markers may be provided and arranged to form a rectangle or a straight line, or four fiducial markers may be provided in a non-linear pattern. Such examples are for illustration purposes only and not limitation. Any suitable number and arrangement of fiducial markers 12 may be provided in various embodiments.

It is possible in various embodiments to measure distances between and/or define locations of the fiducial markers based any of several points thereon, for example a point on an edge or outer surface of the fiducial marker, such as an apex, may be used. In some embodiments, the fiducial marker may be or approximate a portion of a sphere, such as a hemisphere, e.g., each fiducial marker of the plurality of fiducial markers may partially define a spherical surface. In such embodiments, a centroid 120 (FIGS. 7 and 8) or center of mass of the fiducial marker 12 may be used to define the location of the fiducial marker 12 for purposes of analysis. In some such embodiments, the centroid 120 of the fiducial marker 12 for analysis purposes may be the actual centroid defined by the physical geometry of the, e.g., hemispherical, fiducial marker. In other exemplary embodiments, an image processor 26 may calculate or derive a centroid 120 of a complete sphere 13 from the partial, e.g., half, sphere defined by the fiducial marker 12. That is, the centroid of the fiducial marker for analysis purposes in some exemplary methods of monitoring as set forth herein may be a virtual centroid, e.g., the centroid of a sphere, where the fiducial marker defines a portion of the sphere. See, for example, FIG. 2, where fiducial marker 12 defines about half of a sphere 13, the remainder of the sphere 13 indicated by dashed lines extending from outer surface 14.

A centroid in accordance with the present disclosure is a geometric center of a region, which may be a two-dimensional or three-dimensional region, and is thus the arithmetic mean or average position of all points in the shape. In exemplary embodiments, a centroid may be located through use of the imaging device 24 and processor 26. Processor 26, in analyzing an image of, for example, a fiducial marker, may calculate and thus locate the centroid of the fiducial marker, which may be a physical centroid or a virtual centroid, as discussed above.

Figure 7:
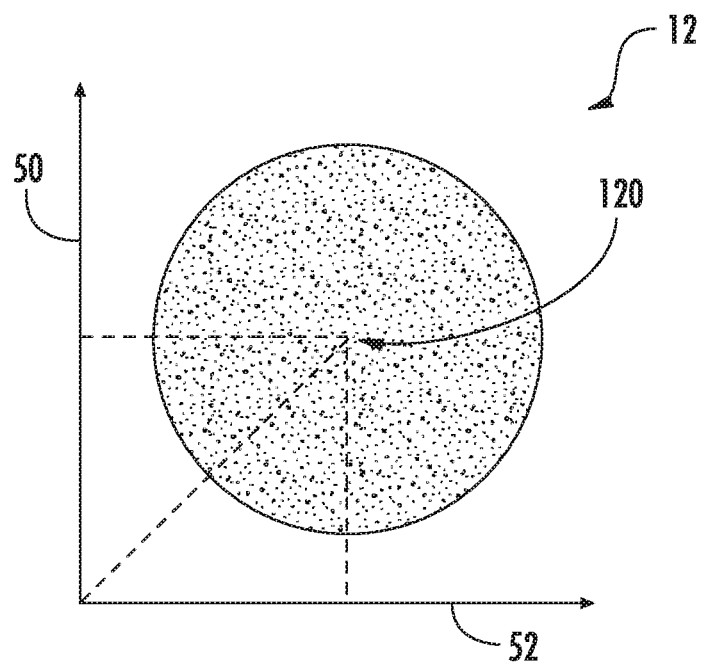
FIG. 7 is an overhead view of an exemplary fiducial marker at a first time in accordance with embodiments of the present disclosure.
Figure 8:
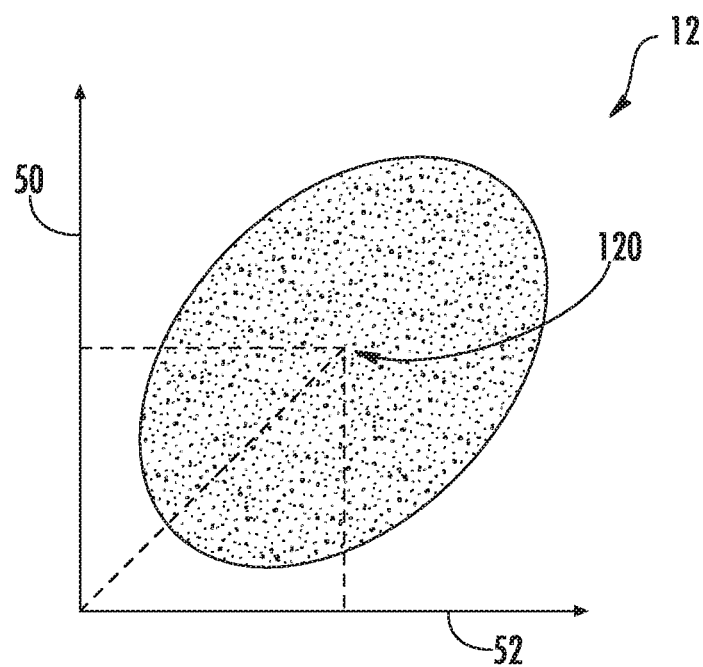
FIG. 8 is a section view of the fiducial marker of FIG. 7 at a second time in accordance with embodiments of the present disclosure.

Using the centroid of the fiducial markers 12 as the reference point for distance measurement may advantageously reduce or minimize error due to deformation of the markers 12. For example, FIG. 7 illustrates an exemplary fiducial marker 12 in an initial condition, e.g., as manufactured, and FIG. 8 illustrates the fiducial marker 12 of FIG. 7 in a subsequent condition, e.g., after the component 10 on which marker 12 is situated has been subjected to at least one duty cycle. In this example, the distance between a point on the edge of marker 12 and another point on an adjacent marker may change merely because the shape of marker 12 changed such that points along the edge or circumference of marker 12 are displaced due to deformation of marker 12 instead of or in addition to any deformation of the component 10. In contrast, the location of the centroid 120 remains relatively constant as compared to the location of points along the edge of the marker 12, and as such a truer picture of the deformation of the component 10 may be obtained by defining the location of each marker 12, and the distances between markers, based on the centroid(s) 120. In FIGS. 7 and 8, the location of centroid 120 is defined in a coordinate system with reference to mutually orthogonal axes 50, 52, which may be any two of the X-axis, Y-axis or Z-axis, as described below and illustrated in FIG. 4. In further exemplary embodiments, the location of centroid 120 may be defined in a three-dimensional coordinate system with reference to all three of the X-axis, Y-axis and Z-axis.

Figure 5:
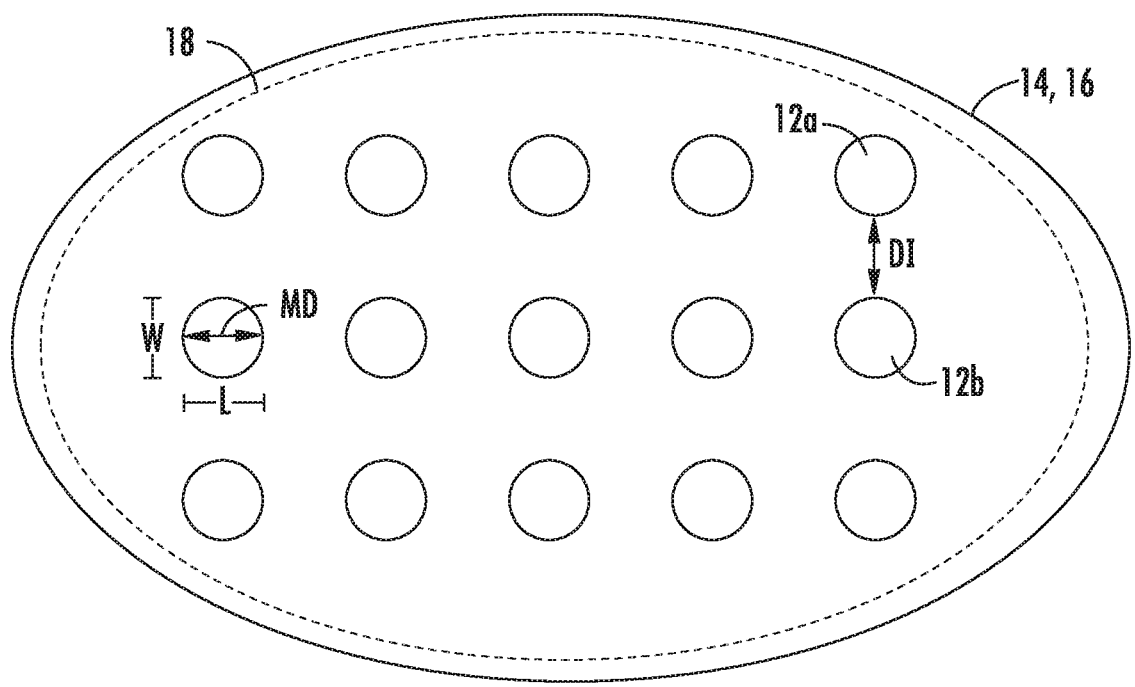
FIG. 5 is a an overhead view of a plurality of fiducial markers in accordance with embodiments of the present disclosure.
Figure 6:
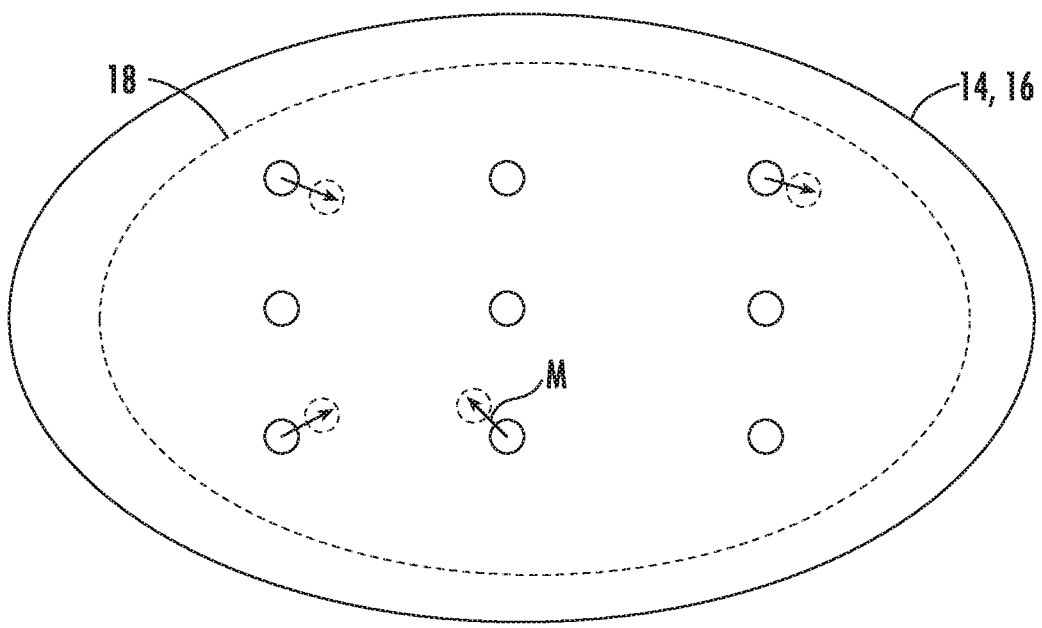
FIG. 6 is a an overhead view of a plurality of fiducial markers in accordance with embodiments of the present disclosure.

Referring now to FIGS. 1 through 6, an exemplary embodiment of a system for monitoring component deformation is illustrated. Such systems in accordance with the present disclosure may facilitate improved local and/or global strain analysis by measuring fiducial markers 12 along three axes (conventionally termed as an X-axis, Y-axis and Z-axis and which are mutually orthogonal). Movements M (FIG. 6) of the fiducial markers 12 may be tracked in each plane as the system 23 measures the relative displacement of each marker, and thereby the deformation of the component 10, as illustrated in FIG. 5. The system 23 may include, for example, a plurality of fiducial markers 12 which are positioned on the exterior surface 14 of one or more components as discussed above. Further, system 23 may include a three-dimensional data acquisition device 24, such as in exemplary embodiments an optical scanner 24 (FIG. 4), for analyzing the fiducial markers 12, and a processor 26 in operative communication with the three-dimensional data acquisition device.

In general, as used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor 26 may also include various input/output channels for receiving inputs from and sending control signals to various other components with which the processor 26 is in communication, such as the three-dimensional data acquisition device 24. The processor 26 may further include suitable hardware and/or software for storing and analyzing inputs and data from the three-dimensional data acquisition device 24, and for generally performing method steps as described herein.

Notably, processor 26 (or components thereof) may be integrated within the optical data acquisition device 24. In additional or alternative embodiments, the processor 26 (or components thereof) may be separate from the data acquisition device 24. In exemplary embodiments, for example, processor 26 includes components that are integrated within the data acquisition device 24 for initially processing data received by the data acquisition device 24, and components that are separate from the data acquisition device 24 for measuring the fiducial markers 12 and/or assembling contemporary three-dimensional profiles from the data and comparing these profiles.

In general, processor 26 is operable for directly measuring the fiducial markers 12 along an X-axis, a Y-axis and a Z-axis to obtain X-axis data points, Y-axis data points, and Z-axis data points and create accurate 3D digital replications of the topology of surface 14. As discussed, the axes are mutually orthogonal. The X-axis data points, Y-axis data points, and Z-axis data points are dimensional data points related to the direct measurement of the fiducial markers 12. Processor 26 may further be operable for locating a centroid 120 of each fiducial marker 12, e.g., determining three-dimensional coordinates representing the location of the centroid 120. By scanning the component 10 at various times, e.g., before and after deformation events such as creep, fatigue, and overloads, the component 10 may be monitored for, e.g. stress and/or strain. The data acquisition device 24 may be operable to perform a single three-dimensional measurement of the component 10 such that a composite measurement is not required or performed. The single three-dimensional measurement of the component 10 produces three-dimensional data and permits three-dimensional strain analysis. Exemplary embodiments of such three-dimensional data may include polygon mesh data within three-dimensional point clouds, including centroid coordinates in a three-dimensional space defined by the mutually orthogonal axes X, Y, and Z. Such three-dimensional data may then be input to deformation analysis algorithms to calculate regional surface strain.

In general, any suitable three-dimensional data acquisition device 24 which utilizes surface metrology techniques to obtain direct measurements in three dimensions may be utilized. In exemplary embodiments, device 24 is a non-contact device which utilizes non-contact surface metrology techniques. Further, in exemplary embodiments, a device 24 in accordance with the present disclosure has a resolution along the X-axis, the Y-axis and the Z-axis of between approximately 100 nanometers and approximately 100 micrometers. Accordingly, and in accordance with exemplary methods, the X-axis data points, Y-axis data points, and Z-axis data points are obtained at resolutions of between approximately 100 nanometers and approximately 100 micrometers.

For example, in some embodiments, suitable optical scanners 24 which optically identify fiducial markers 12 in three dimensions may be utilized. FIG. 4 illustrates an exemplary embodiment of an optical scanner 24 in accordance with the present disclosure, wherein the scanner is a structured light scanner. Structured light scanners generally emit light 28 from included emitter such as light-emitting diodes 30 or other suitable light generating apparatus. In exemplary embodiments, the emitted light 28 utilized by a structured light scanner is blue light or white light. In general, the emitted light 28 is projected onto the fiducial markers 12 and component 10 generally in a particular pattern. When the light 28 contacts the fiducial markers 12 and component 10, the surface contour of the component and fiducial markers 12 distorts the light 28. This distortion may be captured by a detector after the structured light is reflected by the exterior surface, e.g., in an image taken by a camera 32. The image of the light 28 contacting the fiducial markers 12 (and surrounding exterior surface 14) is received by, for example, the processor 26. The processor 26 then calculates X-axis data points, Y-axis data points, and Z-axis data points based on the received images by, for example, comparing the distortions in the light pattern to the expected pattern. Notably, in exemplary embodiments the processor 26 operates such optical scanners 24 to perform various above disclosed steps.

Alternatively, other suitable data acquisition devices may be utilized. For example, in some embodiments, device 24 is a laser scanner. Laser scanners generally include lasers which emit light in the form of laser beams towards objects, such as in these embodiments fiducial markers 12 and turbine components 10 generally. The light is then detected by a sensor of the device 24. For example, in some embodiments, the light is then reflected off of surfaces which it contacts, and received by a sensor of the device 24. The round-trip time for the light to reach the sensor is utilized to determine measurements along the various axes. These devices are typically known as time-of-flight devices. In other embodiments, the sensor detects the light on the surface which it contacts, and determines measurements based on the relative location of the light in the field-of-view of the sensor. These devices are typically known as triangulation devices. X-axis, Y-axis and Z-axis data points are then calculated based on the detected light, as mentioned. Notably, in exemplary embodiments processor 26 performs and operates such data acquisition devices 24 to perform various above disclosed steps.

In some embodiments, the light emitted by a laser is emitted in a band which is only wide enough to reflect off a portion of object to be measured, such as the plurality of fiducial markers 12. In these embodiments, a stepper motor or other suitable mechanism for moving the laser may be utilized to move the laser and the emitted band as required until light has been reflected off of the entire object to be measured.

Still further, other suitable three-dimensional data acquisition devices 24 may be utilized. Alternatively, however, the present disclosure is not limited to the use of three-dimensional data acquisition devices 24. For example, and in particular in embodiments wherein the fiducial markers are not provided on the exterior surface 14 but rather are underneath the exterior surface, other suitable devices include electrical field scanners, which may include for example an eddy current coil, a Hall Effect probe, a conductivity probe, and/or a capacitance probe.

Figure 9:
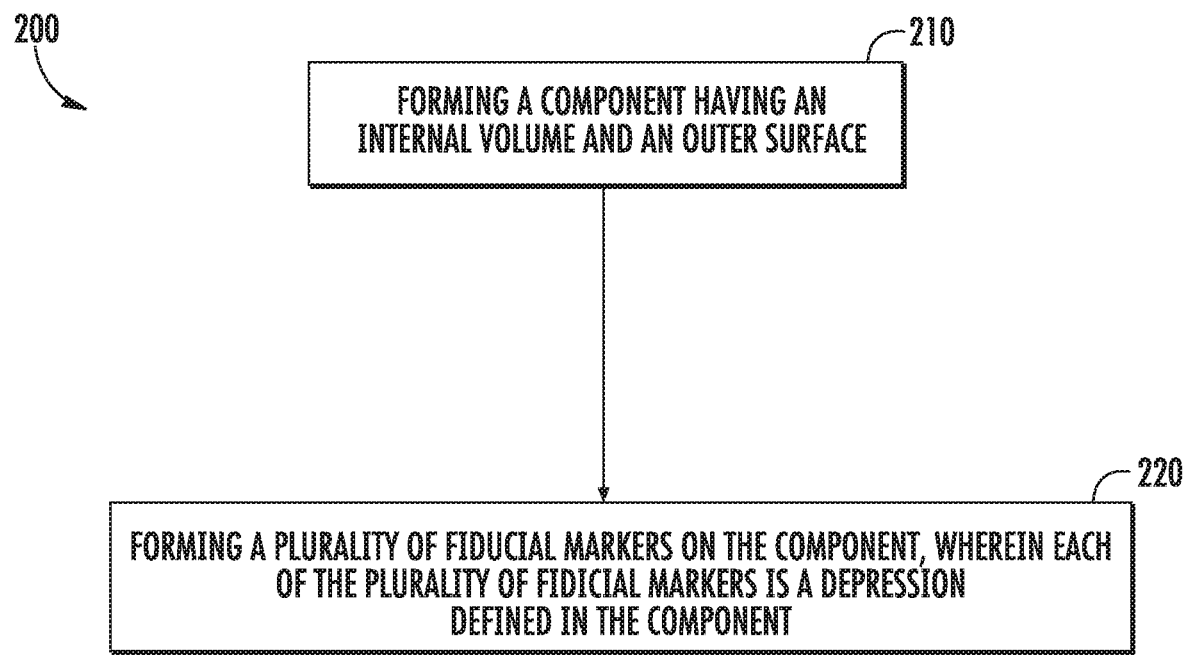
FIG. 9 is a flow chart illustrating a method of making a component in accordance with embodiments of the present disclosure.

Referring now to FIG. 9, an exemplary method 200 of making a component with an integral strain indicator is illustrated. The method 200 includes the step 210 of forming the component 10 with an internal volume and an outer surface. The method 200 further includes step 220 of forming a plurality of fiducial markers on the component. As discussed, each fiducial marker 12 may be a depression defined in the component 10.

Figure 10:
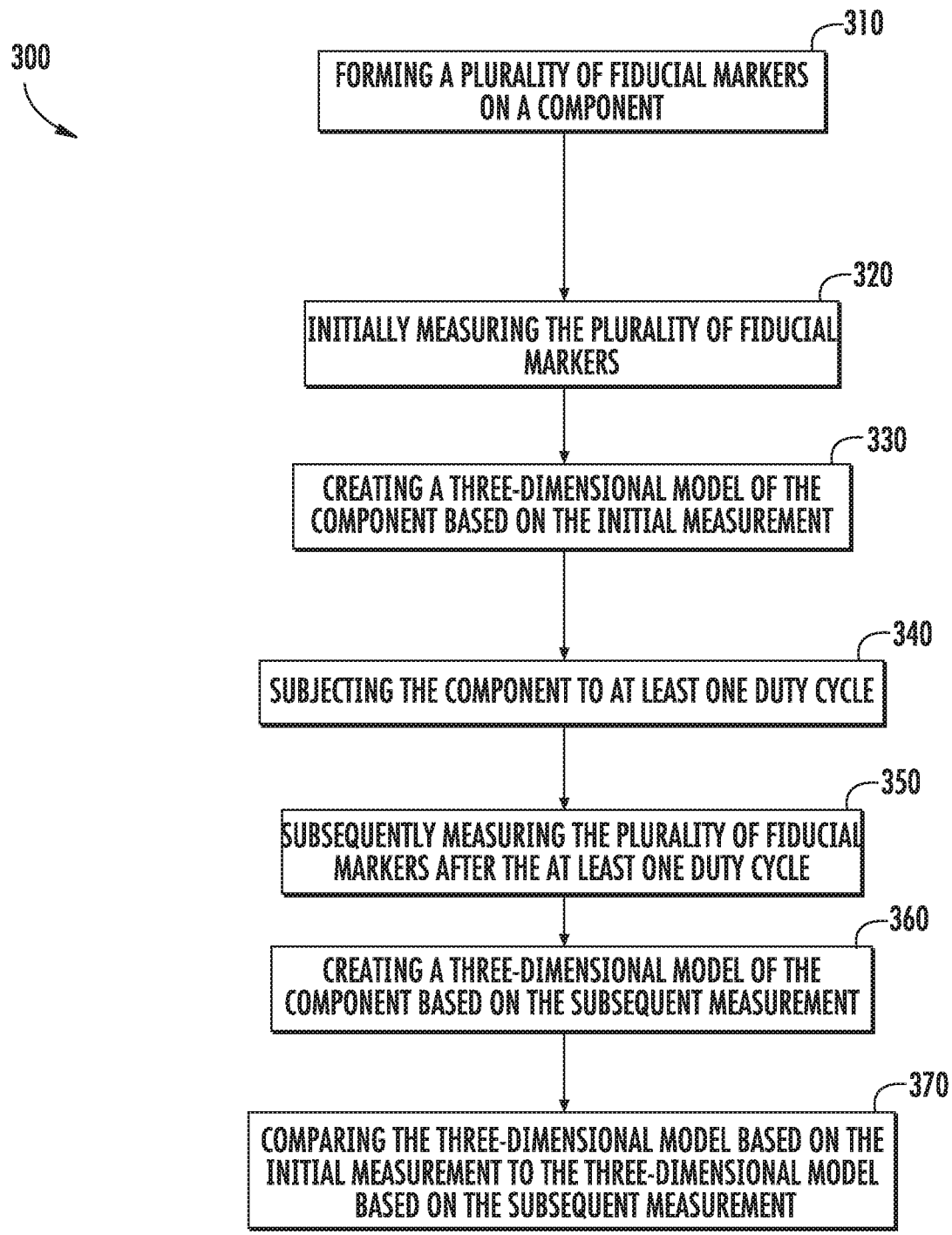
FIG. 10 is a flow chart illustrating a method for monitoring component deformation in accordance with embodiments of the present disclosure.

Referring now to FIG. 10, an exemplary method 300 of monitoring a component, the component including an internal volume and an outer surface, is illustrated. Such methods 300 in exemplary embodiment may, in whole or in part, be performed by processors 26 as discussed herein. Method 300 may include the step 310 of forming a plurality of fiducial markers 12 on the component 10. Method 300 includes the step 320 of initially measuring the plurality of fiducial markers 12, such as directly measuring with a three-dimensional data acquisition device 24. Method 300 further includes the step 330 of creating a three-dimensional model of the component 10 based on the initial measurement, such as using the X-axis, Y-axis and Z-axis data points as discussed herein. Such step may occur at a first time. Method 300 further includes the step 340 of subjecting the component 10 to at least one duty cycle, which may occur after the first time. For example, the duty cycle may occur for turbine components as use in service in a turbomachine or other operation. Alternatively, the duty cycle may generally be accomplished through use of the component 10 in the environment for which it was designed to be utilized. Method 300 further includes the step 350 of subsequently measuring the plurality of fiducial markers 12 after the at least one duty cycle (and at a second time after the first time), such as directly measuring with a three-dimensional data acquisition device 24. Method 300 further includes the step 360 of creating a three-dimensional model of the component 10 based on the subsequent measurement, such as using the X-axis, Y-axis and Z-axis data points as discussed herein. Method 300 further includes the step 370 of comparing the three-dimensional model based on the initial measurement to the three-dimensional model based on the subsequent measurement.

In some embodiments, the three-dimensional model of the component 10 based on the initial measurement may also include a representation of an initial location of each fiducial marker 12, e.g., three-dimensional coordinates representing the location of centroid 120 in a three-dimensional space defined by axes X, Y, and Z, as described above. Some embodiments of the three-dimensional model of the component based on the subsequent measurement may also include a representation of a subsequent location of each fiducial marker, which may be three-dimensional centroid coordinates similar to the representation of the initial location of each fiducial marker. Further, in such embodiments of method 300 the step 370 of comparing may comprise comparing the initial locations of the plurality of fiducial markers to the subsequent locations of the plurality of fiducial markers.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of making a gas turbine component with an integral strain indicator, the method comprising:
   forming the gas turbine component, the gas turbine component comprising an internal volume and an outer surface; and
   forming a plurality of fiducial markers on the gas turbine component, wherein forming the plurality of fiducial markers does not affect a grain structure of the gas turbine component, wherein each of the plurality of fiducial markers is a concave depression defined in and extending into the gas turbine component, and wherein the plurality of fiducial markers are positioned in an analysis region of the gas turbine component, the analysis region defining a gauge length, wherein the analysis region includes a life-limiting region of the gas turbine component, wherein each of the plurality of fiducial markers has a maximum diameter of between one-tenth and one-twentieth of the gauge length,
   wherein the step of forming the plurality of fiducial markers occurs after the step of forming the gas turbine component.

2. The method of claim 1, wherein the plurality of fiducial markers are formed on the outer surface of the gas turbine component.

3. The method of claim 1, wherein the gas turbine component comprises a base component which defines the internal volume and a thermal barrier coating deposited on the base component which defines the outer surface, and wherein the plurality of fiducial markers are formed on the base component.

4. The method of claim 1, wherein the plurality of fiducial markers comprises at least four fiducial markers in a non-linear pattern.

5. The method of claim 1, wherein each fiducial marker of the plurality of fiducial markers is a hemisphere.

6. The method of claim 1, wherein the gauge length of the analysis region is between three-tenths of an inch and one inch.

7. The method of claim 1, wherein the gauge length of the analysis region is at least twenty millimeters.

8. The method of claim 1, wherein each fiducial marker has a maximum diameter between two hundredths of an inch and twelve hundredths of an inch and a maximum depth of between one thousandth of an inch and thirty thousandths of an inch.

9. A method of monitoring a gas turbine component, the gas turbine component comprising an internal volume and an outer surface, the method comprising:
   initially measuring a plurality of fiducial markers formed on the gas turbine component, wherein each of the plurality of fiducial markers is a concave depression defined in and extending into the gas turbine component, wherein the plurality of fiducial markers do not affect the grain structure of the gas turbine component, wherein the plurality of fiducial markers are positioned in an analysis region of the gas turbine component, and wherein the analysis region includes a life-limiting region of the gas turbine component;
   creating a three-dimensional model of the gas turbine component based on the initial measurement;
   subjecting the gas turbine component to at least one duty cycle;
   subsequently measuring the plurality of fiducial markers after the at least one duty cycle;
   creating a three-dimensional model of the gas turbine component based on the subsequent measurement; and
   comparing the three-dimensional model based on the initial measurement to the three-dimensional model based on the subsequent measurement.

10. The method of claim 9, wherein the three-dimensional model of the gas turbine component based on the initial measurement includes a representation of an initial location of each fiducial marker, the three-dimensional model of the gas turbine component based on the subsequent measurement includes a representation of a subsequent location of each fiducial marker, and the step of comparing comprises comparing the initial locations of the plurality of fiducial markers to the subsequent locations of the plurality of fiducial markers.

11. The method of claim 10, wherein the representation of the initial location of each fiducial marker comprises three-dimensional coordinates of a centroid of each fiducial marker and the representation of the subsequent location of each fiducial marker comprises three-dimensional coordinates of the centroid of each fiducial marker.

12. The method of claim 10, wherein the plurality of fiducial markers are initially and subsequently directly measured using a non-contact direct measurement technique.

13. The method of claim 9, wherein the plurality of fiducial markers are initially and subsequently directly measured using a structured light scanner comprising a structured light emitter and a detector.

14. The method of claim 13, wherein the step of initially measuring comprises projecting structured light onto the exterior surface of the gas turbine component and detecting the structured light after the structured light is reflected by the exterior surface, and the step of subsequently measuring comprises projecting structured light onto the exterior surface of the gas turbine component and detecting the structured light after the structured light is reflected by the exterior surface.

15. The method of claim 1, wherein the gas turbine component is a turbine blade.

* * * * *